United States Patent
Chen et al.

(10) Patent No.: US 9,054,286 B1
(45) Date of Patent: Jun. 9, 2015

(54) LIGHT EMITTING DIODE MODULE

(71) Applicant: Lextar Electronics Corporation, Hsinchu (TW)

(72) Inventors: Tsai-Yu Chen, Kaohsiung (TW); Chun-Wei Wang, New Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/256,991

(22) Filed: Apr. 20, 2014

(30) Foreign Application Priority Data

Dec. 9, 2013 (TW) .............................. 102145154 A

(51) Int. Cl.

| H01L 33/00 | (2010.01) |
|---|---|
| H01L 33/58 | (2010.01) |
| H01L 27/15 | (2006.01) |
| H01L 33/50 | (2010.01) |
| H01L 33/60 | (2010.01) |
| H01L 33/62 | (2010.01) |
| H01L 33/46 | (2010.01) |
| H01L 33/44 | (2010.01) |
| H01L 33/54 | (2010.01) |
| H01L 33/52 | (2010.01) |
| H01L 33/56 | (2010.01) |

(52) U.S. Cl.
CPC .............. *H01L 33/58* (2013.01); *H01L 27/15* (2013.01); *H01L 33/50* (2013.01); *H01L 33/60* (2013.01); *H01L 33/62* (2013.01); *H01L 33/46* (2013.01); *H01L 33/44* (2013.01); *H01L 33/54* (2013.01); *H01L 33/52* (2013.01); *H01L 33/56* (2013.01)

(58) Field of Classification Search
CPC ......... H01L 33/62; H01L 33/60; H01L 33/54; H01L 33/58; H01L 33/56; H01L 33/44; H01L 33/52; H01L 33/46
See application file for complete search history.

(56) References Cited

U.S. PATENT DOCUMENTS

| 2007/0070530 A1* | 3/2007 | Seo et al. ...................... 359/819 |
| 2008/0297020 A1* | 12/2008 | Wanninger et al. ........... 313/110 |
| 2009/0213469 A1* | 8/2009 | Braune et al. ................. 359/642 |
| 2013/0143339 A1* | 6/2013 | Tischler et al. ................ 438/27 |
| 2013/0161665 A1* | 6/2013 | Kuwaharada et al. ......... 257/88 |
| 2013/0299682 A1* | 11/2013 | Fouquet et al. ............... 250/216 |
| 2014/0151731 A1* | 6/2014 | Tran .............................. 257/98 |
| 2014/0320781 A1* | 10/2014 | Park et al. ...................... 349/61 |

FOREIGN PATENT DOCUMENTS

| TW | 201245771 | 11/2012 |
| TW | I386725 B | 2/2013 |

* cited by examiner

*Primary Examiner* — Ngan Ngo
(74) *Attorney, Agent, or Firm* — CKC & Partners Co., Ltd.

(57) ABSTRACT

A light emitting diode module includes a lead frame, a first light emitting diode chip, a second light emitting diode chip, an encapsulant, and a lens structure. The lead frame has a die-bonding surface and a side wall together defining an accommodating recess. The encapsulant is filled in the accommodating recess, and covers the first and the second light emitting diode chips. The lens structure disposed on the lead frame has a bottom surface, a reflective surface, a first, a second, a third, and a fourth light emitting curved surface. The light emitting curved surfaces are respectively disposed opposite to the bottom surface. An adjacent position among the light emitting curved surfaces is a lowest point nearest to the bottom surface. The first and the second light emitting diode chips are disposed at the projections of the first and the second light emitting curved surface on the die-bonding surface.

25 Claims, 9 Drawing Sheets

LIGHT EMITTING DIODE MODULE

RELATED APPLICATIONS

This application claims priority to Taiwan Application Serial Number 102145154, filed Dec. 9, 2013, which is herein incorporated by reference.

BACKGROUND

1. Field of Invention

The present invention relates to a light emitting diode module.

2. Description of Related Art

A light emitting diode (LED) is a kind of luminous semiconductor device. With the recombination of holes and electrons in semiconductor of a luminous layer in the LED, the luminous layer therein generates photons and emits light. Since the wavelength of the light emitted from the LED is limited by the semiconductor materials, light mixing technology can be applied to generate a light of a specific wavelengths.

The light with the specific wavelength can be obtained by mixing different light emitting diodes that respectively emit light with different wavelengths. For example, the blue, the red, and the green light can be mixed to obtain white light. The white light, however, may be unsatisfied if the blue, the red, and the green light emitting diodes are not mixed uniformly, which reduces the quality of light emitting diode device.

SUMMARY

An aspect of the present invention is to provide a light emitting diode module including a lead frame, a first light emitting diode chip, a second light emitting diode chip, an encapsulant, and a lens structure. The lead frame has a die-bonding surface and at least one side wall together defining an accommodating recess. The first light emitting diode chip and the second light emitting diode chip are separately disposed on the die-bonding surface of the lead frame. The encapsulant is filled in the accommodating recess and covers the first and the second light emitting diode chips. The lens structure is disposed on the lead frame. The lens structure has a first light emitting curved surface, a second light emitting curved surface, a third light emitting curved surface, a fourth light emitting curved surface, a bottom surface, and at least one reflective surface. The first, the second, the third, and the fourth light emitting curved surfaces are disposed opposite to the bottom surface, and an adjacent position among the first, the second, the third, and the fourth light emitting curved surfaces is a lowest point nearest to the bottom surface. The first and the second light emitting curved surfaces are symmetric with respect to the lowest point, and the third and the fourth light emitting curved surfaces are symmetric with respect to the lowest point. The third light emitting curved surface is adjacent to the first and the second light emitting curved surfaces, and the fourth light emitting curved surface is adjacent to the first and the second light emitting curved surfaces. The reflective surface is connected to the first, the second, the third, the fourth light emitting curved surfaces, and edges of the bottom surface. The first and the second light emitting diode chips are respectively disposed at projections of the first and the second light emitting curved surfaces on the die-bonding surface, and a projection of the lowest point on the die-bonding surface is between the first and the second light emitting diode chips.

In one or more embodiments, the first light emitting diode chip emits a first light beam that directly emerges from the first light emitting curved surface or emerges from the first light emitting curved surface after being reflected by the reflective surface, and the second light emitting diode chip emits a second light beam that directly emerges from the second light emitting curved surface or emerges from the second light emitting curved surface after being reflected by the reflective surface.

In one or more embodiments, the wavelengths of the first and the second light beams respectively emitted from the first and the second light emitting diode chips are the same or different.

In one or more embodiments, the light emitting diode module further includes a third light emitting diode chip and a fourth light emitting diode chip respectively disposed at projections of the third and the fourth light emitting curved surfaces on the die-bonding surface. The projection of the lowest point on the die-bonding surface is further between the third and the fourth light emitting diode chips.

In one or more embodiments, the third light emitting diode chip emits a third light beam that directly emerges from the third light emitting curved surface or emerges from the third light emitting curved surface after being reflected by the reflective surface, and the fourth light emitting diode chip emits a fourth light beam that directly emerges from the fourth light emitting curved surface or emerges from the fourth light emitting curved surface after being reflected by the reflective surface.

In one or more embodiments, the wavelengths of the third and the fourth light beams respectively emitted from the third and the fourth light emitting diode chips are the same or different.

In one or more embodiments, the light emitting diode module further includes at least one wavelength converting material covering the first and/or the second and/or the third and/or the fourth light emitting diode chips, and respectively converting a portion of the first light beam and/or a portion of the second light beam and/or a portion of the third light beam and/or a portion of the fourth light beam into a fifth light beam, a sixth light beam, a seventh light beam, and/or an eighth light beam. The wavelength of the fifth light beam is greater than the wavelength of the first light beam, the wavelength of the sixth light beam is greater than the wavelength of the second light beam, the wavelength of the seventh light beam is greater than the wavelength of the third light beam, and the wavelength of the eighth light beam is greater than the wavelength of the fourth light beam.

In one or more embodiments, the fifth, the sixth, the seventh, and the eighth light beams respectively directly emerge from the first, the second, the third, and the fourth light emitting curved surfaces, or emerge from the first, the second, the third, and the fourth light emitting curved surfaces after being reflected by the reflective surface.

In one or more embodiments, the reflective surface is a total internal reflection surface.

In one or more embodiments, an angle is formed between the reflective surface and the bottom surface, and the angle is about 90 degrees to 135 degrees.

In one or more embodiments, a distance d is formed between the lowest point and the bottom surface, the lens structure has a maximum thickness h, and the maximum thickness h and the distance d satisfy the following relationship:

$h > 0$, and $0 < d \leq (\frac{1}{2})h$.

In one or more embodiments, the projection of the lowest point on the die-bonding surface overlaps a center point between the first and the second light emitting diode chips.

In one or more embodiments, the light emitting diode module further includes a plurality of microstructures disposed on the first, the second, the third, and the fourth light emitting curved surfaces of the lens structure.

In one or more embodiments, the lens structure is detachably disposed on the lead frame.

Another aspect of the present invention is to provide a light emitting diode module including a lead frame, a first light emitting diode chip, a second light emitting diode chip, an encapsulant, and a lens structure. The lead frame has a die-bonding surface and at least one side wall together defining an accommodating recess. The first light emitting diode chip and the second light emitting diode chip separately disposed on the die-bonding surface of the lead frame. The encapsulant is filled in the accommodating recess and covers the first and the second light emitting diode chips. The lens structure is disposed on the lead frame, and the lens structure has a first reflective surface, a second reflective surface, a first light emitting curved surface, a second light emitting curved surface, and a bottom surface. The first and the second light emitting curved surfaces are disposed opposite to the bottom surface. The first and the second reflective surface are connected to the bottom surface, and the first and the second light emitting curved surfaces. An adjacent position between the first and the second light emitting curved surfaces is a lowest line nearest to the bottom surface. The first and the second light emitting diode chips are respectively disposed at the projections of the first and the second light emitting curved surfaces on the die-bonding surface, and are symmetric with respect to a projection of the lowest line on the die-bonding surface.

In one or more embodiments, the first light emitting diode chip emits a first light beam that directly emerges from the first light emitting curved surface or emerges from the first light emitting curved surface after being reflected by the first reflective surface, and the second light emitting diode chip emits a second light beam that directly emerges from the second light emitting curved surface or emerges from the second light emitting curved surface after being reflected by the second reflective surface.

In one or more embodiments, the wavelengths of the first and the second light beams respectively emitted from the first and the second light emitting diode chips are the same or different.

In one or more embodiments, the light emitting diode module further includes at least one wavelength converting material covering the first and/or the second light emitting diode chips, and respectively converting a portion of the first light beam and/or a portion of the second light beam into a third light beam and/or a fourth light beam. The wavelength of the third light beam is greater than the wavelength of the first light beam, and the wavelength of the fourth light beam is greater than the wavelength of the second light beam.

In one or more embodiments, the third and the fourth light beams respectively directly emerge from the first and the second light emitting curved surfaces, or emerge from the first and the second light emitting curved surfaces after being respectively reflected by the first and the second reflective surfaces.

In one or more embodiments, the projection of the lowest line on the die-bonding surface passes through a center point between the first and the second light emitting diode chips.

In one or more embodiments, the first and the second reflective surfaces are total internal reflection surfaces.

In one or more embodiments, an angle is formed between the first reflective surface and the bottom surface, and another angle is formed between the second reflective surface and the bottom surface, and the angles are about 90 degrees to 135 degrees respectively.

In one or more embodiments, a distance d is formed between the lowest line and the bottom surface, the lens structure has a maximum thickness h, and the maximum thickness h and the distance d satisfy the following relationship: $h>0$, and $0<d\leq(½)h$.

In one or more embodiments, the light emitting diode module further includes a plurality of microstructures disposed on the first and the second light emitting curved surfaces of the lens structure.

In one or more embodiments, the lens structure is detachably disposed on the lead frame.

The light emitting diode modules mentioned above can mix light emitted from each of the light emitting diode chips via the lens structure, leading to a uniform optical output.

DETAILED DESCRIPTION

Figure 1:
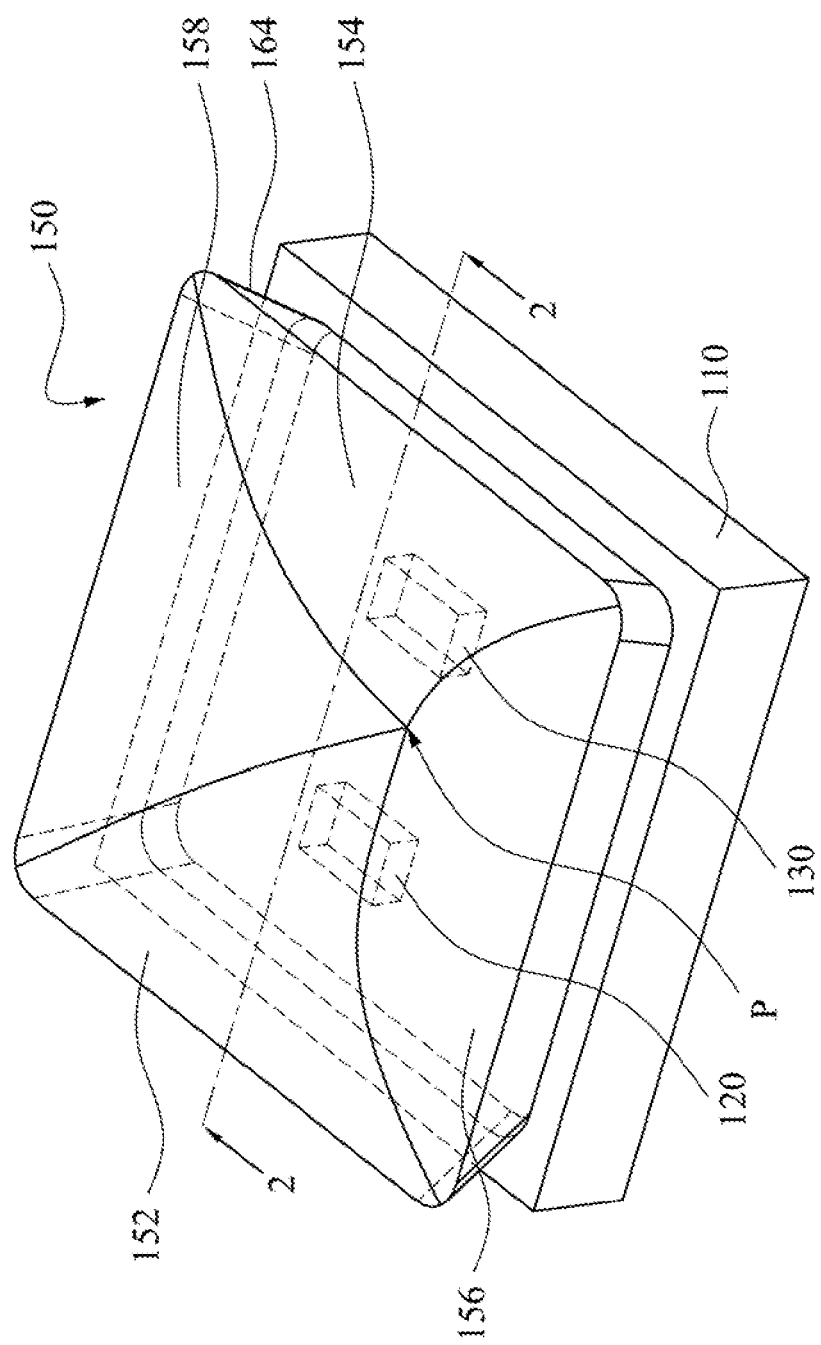
FIG. 1 is a three dimensional view of a light emitting diode module according to the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
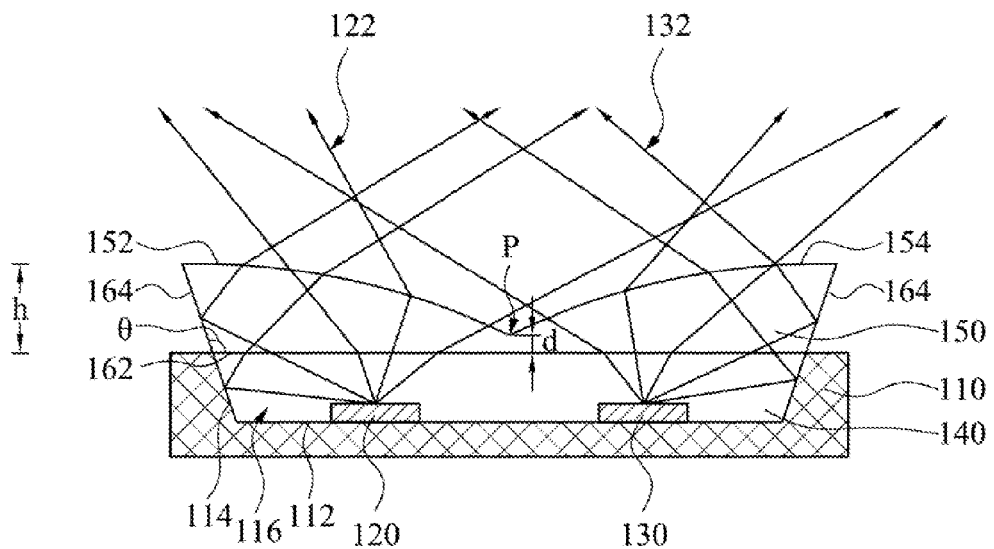
FIG. 2 is a cross sectional view taken along line 2-2 in FIG. 1.

FIG. 1 is a three dimensional view of a light emitting diode module according to the first embodiment of the present invention, and FIG. 2 is a cross sectional view taken along line 2-2 in FIG. 1. Reference is made to FIGS. 1 and 2. The light emitting diode module includes a lead frame 110, a first light emitting diode chip 120, a second light emitting diode chip 130, an encapsulant 140, and a lens structure 150. The lead frame 110 has a die-bonding surface 112 and at least one side wall 114 together defining an accommodating recess 116. The first light emitting diode chip 120 and the second light emitting diode chip 130 are separately disposed on the die-bonding surface 112 of the lead frame 110. The encapsulant 140 is filled in the accommodating recess 116 and covers the first light emitting diode chip 120 and the second light emitting diode chip 130. The lens structure 150 is disposed on the lead frame 110. The lens structure 150 has a first light emitting curved surface 152, a second light emitting curved surface 154, a third light emitting curved surface 156, a fourth light emitting curved surface 158, a bottom surface 162, and at least one reflective surface 164. The light emitting curved surfaces 152, 154, 156, and 158 are disposed opposite to the bottom surface 162, and an adjacent position among the light emitting curved surfaces 152, 154, 156, 158 is a lowest point P nearest to the bottom surface 162. The first light emitting curved surface 152 and the second light emitting curved surface 154 are symmetric with respect to the lowest point P, and the third light emitting curved surface 156 and the fourth light emitting curved surface 158 are symmetric with respect to the lowest point P. The third light emitting curved surface 156 is adjacent to the first light emitting curved surface 152 and the second light emitting curved surface 154, and the fourth light emitting curved surface 158 is adjacent to the first light emitting curved surface 152 and the second light emitting curved surface 154. The reflective surface 164 is connected to the light emitting curved surfaces 152, 154, 156, 158, and edges of the bottom surface 162. The first light emitting diode chip 120 and the second light emitting diode chip 130 are respectively disposed at projections of the first light emitting curved surface 152 and the second light emitting curved surface 154 on the die-bonding surface 112, and a projection of the lowest point P on the die-bonding surface 112 is between the first light emitting diode chip 120 and the second light emitting diode chip 130.

The light emitting diode module in this embodiment can mix light emitted from the first light emitting diode chip 120 and the second light emitting diode chip 130 via the lens structure 150, leading to a uniform optical output.

In greater detail, reference is made to FIG. 2. In this embodiment, the first light emitting diode chip 120 emits a first light beam 122 that directly emerges from the first light emitting curved surface 152 or emerges from the first light emitting curved surface 152 after being reflected by the reflective surface 164. The second light emitting diode chip 130 emits a second light beam 132 that directly emerges from the second light emitting curved surface 154 or emerges from the second light emitting curved surface 154 after being reflected by the reflective surface 164. More specifically, for the first light emitting diode chip 120, the shape of the first light emitting curved surface 152 can be designed to control the propagation direction and uniformity of the first light beam 122. For example, the first light emitting curved surface 152 can be a surface curved away from the first light emitting diode chip 120. Furthermore, the reflective surface 164 can reflect a portion of the first light beam 122 to the first light emitting curved surface 152 to enhance the intensity of the first light beam 122. Similarly, for the second light emitting diode chip 130, the shape of the second light emitting curved surface 154 can be designed to control the propagation direction and uniformity of the second light beam 132. For example, the second light emitting curved surface 154 can be a surface curved away from the second light emitting diode chip 130. Furthermore, the reflective surface 164 can reflect a portion of the second light beam 132 to the second light emitting curved surface 154 to enhance the intensity of the second light beam 132.

In this embodiment, the wavelengths of the first light beam 122 and the second light beam 132 respectively emitted from the first light emitting diode chip 120 and the second light emitting diode chip 130 can be different. For example, the first light beam 122 can be blue light, and the second light beam 132 can be red light, and the claimed scope of the present invention is not limited in this respect. The blue light and the red light can be mixed to be purple light uniformly after they pass through the lens structure 150.

In one or more embodiments, the reflective surface 164 is a total internal reflection (TIR) surface. In other words, the light can be reflected due to the reflective index difference between the lens structure 150 and surrounded medium, such as the air. However, the claimed scope of the present invention should not be limited in this respect. Basically, an embodiment fails within the claimed scope of the present invention if the reflective surface 164 can reflect the first light beam 122 and the second light beam 132.

In one or more embodiments, an angle θ can be formed between the reflective surface 164 and the bottom surface 162, and the angle θ is about 90 degrees to 135 degrees. Accordingly, the reflective surface 164 can respectively guide the first light beam 122 and the second light beam 132 to the first light emitting curved surface 152 and the second light emitting curved surface 154, and the first light beam 122 and the second light beam 132 can be incident the reflective surface 164 at a large angle so as to be reflected by the reflective surface 164.

In one or more embodiments, a distance d is formed between the lowest point P and the bottom surface 162. The lens structure 150 has a maximum thickness h, and the maximum thickness h and the distance d satisfy the following relationship:

h>0, and 0<d≤(½)h. That is, the light emitting curved surfaces 152, 154, 156, and 158 are caved in towards to the lowest point P. It is noted that the maximum thickness h can be defined as a maximum vertical distance between the bottom surface 162 and each of the light emitting curved surfaces 152, 154, 156, and 158. Therefore, in FIG. 2, the maximum thickness h is the vertical distance between the bottom surface 162 and the adjacent position between the first light emitting curved surface 152 and the reflective surface 164, and is also the vertical distance between the bottom surface 162 and the adjacent position between the second light emitting curved surface 154 and the reflective surface 164. However, the claimed scope of the present invention should not be limited in this respect.

In one or more embodiments, the projection of the lowest point P on the die-bonding surface 112 overlaps a center point between the first light emitting diode chip 120 and the second light emitting diode chip 130. In other words, the first light emitting diode chip 120 and the second light emitting diode chip 130 are symmetric with respect to the projection of the lowest point P on the die-bonding surface 112. As such, the propagation directions of the first light beam 122 and the second light beam 132 passing through the lens structure 150 are symmetric with respect to the lowest point P if the shapes of the first light emitting curved surface 152 and the second light emitting curved surface 154 are symmetric with respect to the lowest point P, and the uniformity of the mixed light can be enhanced. In other embodiments, however, the projection of the lowest point P on the die-bonding surface 112 may not overlap the center point between the first light emitting diode chip 120 and the second light emitting diode chip 130. Basically, an embodiment falls within the claimed scope of the present invention if the projection of the lowest point P on the die-bonding surface 112 falls between the first light emitting diode chip 120 and the second light emitting diode chip 130.

In one or more embodiments, the lens structure 150 can be fixed on the lead frame 110 by adhering. For example, the lens structure 150 can be adhered on the encapsulant 140, and the claimed scope of the present invention is not limited in this respect. Basically, an embodiment falls within the claimed scope of the present invention if the lens structure 150 can be fixed on the lead frame 110 and/or the encapsulant 140.

Figure 3:
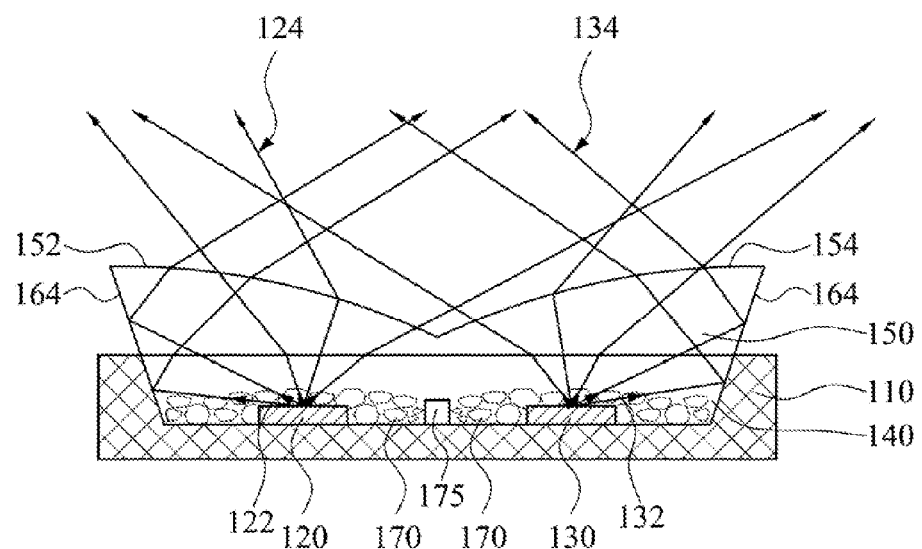
FIG. 3 is a cross sectional view of a light emitting diode module according to the second embodiment of the present invention.

Reference is made to FIG. 3 which is a cross sectional view of a light emitting diode module according to the second embodiment of the present invention. The cross sectional position of FIG. 3 is the same as that of FIG. 2. The difference between the second embodiment and the first embodiment pertains to the wavelength converting material 170. In this embodiment, the light emitting diode module further includes at least one wavelength converting material 170 covering the first light emitting diode chip 120 and/or the second light emitting diode chip 130, and respectively converting a portion of the first light beam 122 and/or a portion of the second light beam 132 into a fifth light beam 124 and/or a sixth light beam 134. The wavelength of the fifth light beam 124 is greater than that of the first light beam 122, and the wavelength of the sixth light beam 134 is greater than that of the second light beam 132. For example, in this embodiment, the wavelength converting materials 170 cover the first light emitting diode chip 120 and the second light emitting diode chip 130, and respectively converts a portion of the first light beam 122 and a portion of the second light beam 132 into the fifth light beam 124 and the sixth light beam 134. The light emitting diode module can further includes a bump portion 175 disposed on the die-bonding surface 112 of the lead frame 110. The bump portion 175 is configured for separating the wavelength converting materials 170 respectively covering the first light emitting diode chip 120 and the second light emitting diode chip 130.

In one embodiment, the wavelengths of the first light beam 122 and the second light beam 132 can be the same, and the wavelengths of the fifth light beam 124 and the sixth light beam 134 can be different. In other words, the wavelength converting material 170 covering the first light emitting diode chip 120 can be different from the wavelength converting material 170 covering the second light emitting diode chip 130. In other embodiments, the wavelengths of the first light beam 122 and the second light beam 132 can be different, and the wavelengths of the fifth light beam 124 and the sixth light beam 134 can also be different. In yet another embodiments, the wavelength converting material 170 can only cover the first light emitting diode chip 120, such that the wavelength of the fifth light beam 124 is different from that of the second light beam 132. Basically, an embodiment falls within the claimed scope of the present invention if the light beams respectively emitted from the first light emitting diode chip 120 and the second light emitting diode chip 130 that incident the lens structure 150 have different wavelengths from each other, and the lens structure 150 can mix the light beams.

Similarly, the fifth light beam 124 converted by the wavelength converting material 170 can directly emerge from the first light emitting curved surface 152, or emerge from the first light emitting curved surface 152 after being reflected by the reflective surface 164. The sixth light beam 134 converted by the wavelength converting material 170 can directly emerge from the second light emitting curved surface 154, or emerge from the second light emitting curved surface 154 after being reflected by the reflective surface 164. Other relevant structural details of the second embodiment are all the same as the first embodiment, and, therefore, a description in this regard will not be repeated hereinafter.

Figure 4:
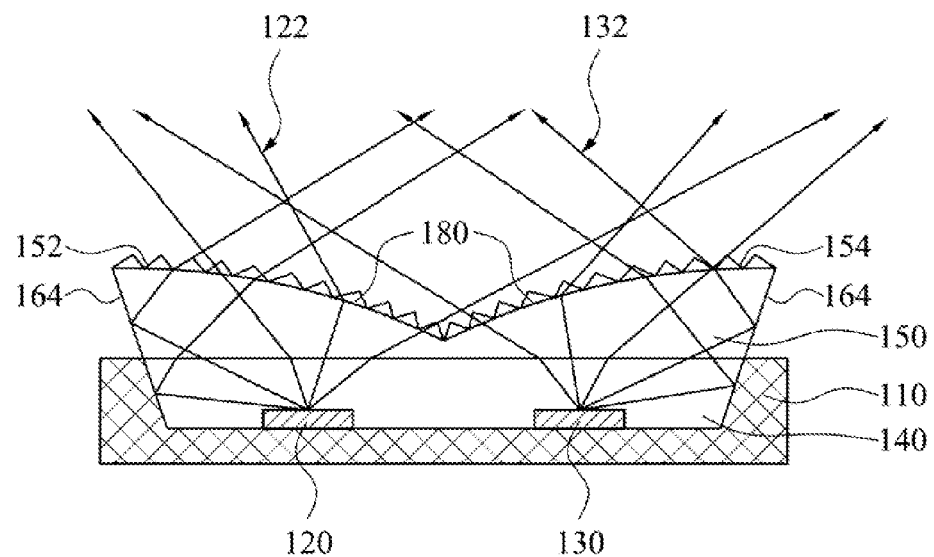
FIG. 4 is a cross sectional view of a light emitting diode module according to the third embodiment of the present invention.

Reference is made to FIG. 4 which is a cross sectional view of a light emitting diode module according to the third embodiment of the present invention. The cross sectional position of FIG. 4 is the same as that of FIG. 2. The difference between the third embodiment and the first embodiment pertains to microstructures 180. In this embodiment, the light emitting diode module can further include a plurality of the microstructures 180 disposed on the light emitting curved surfaces 152, 154, 156, and/or 158 of the lens structure 150. For example, the microstructures 180 are disposed on the first light emitting curved surface 152 and the second light emitting curved surface 154 of the lens structure 150 in FIG. 4. More specifically, the first light beam 122 and the second light beam 132 can be incident on the microstructures 180 respectively through the first light emitting curved surface 152 and the second light emitting curved surface 154. The microstructures 180 are configured for further deflecting the first light beam 122 and/or the second light beam 132 to enlarge light emitting angles of the first light beam 122 and the second light beam 132, and the optical properties of the light emitting diode module can be controlled. Other relevant structural details of the third embodiment are all the same as the first embodiment, and, therefore, a description in this regard will not be repeated hereinafter.

Figure 5:
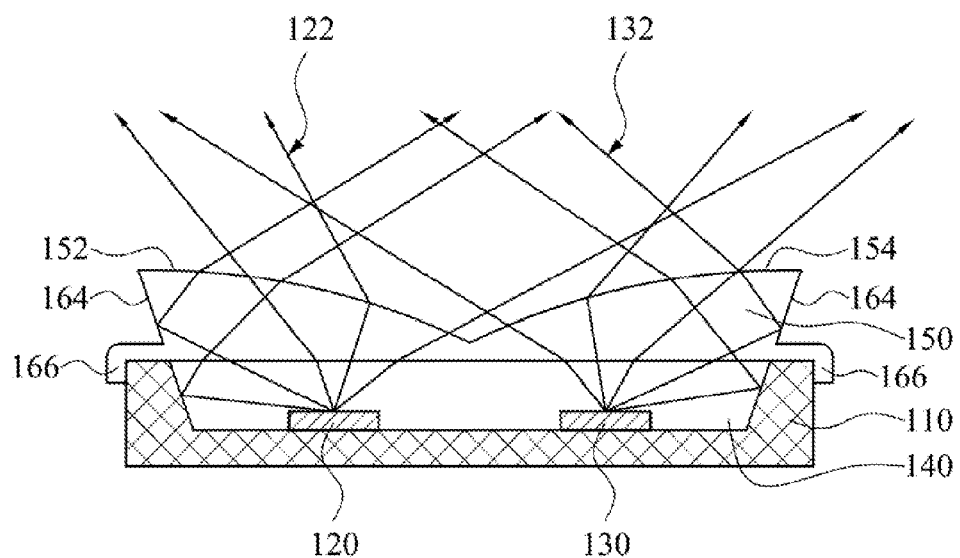
FIG. 5 is a cross sectional view of a light emitting diode module according to the fourth embodiment of the present invention.

Reference is made to FIG. 5 which is a cross sectional view of a light emitting diode module according to the fourth embodiment of the present invention. The cross sectional position of FIG. 5 is the same as that of FIG. 2. The difference between the fourth embodiment and the first embodiment pertains to the configuration of the lens structure 150. In this embodiment, the lens structure 150 is detachably disposed on the lead frame 110. In the embodiment of FIG. 5, the lens structure 150 can include two couplers 166 respectively connected to the reflective surface 164. The lens structure 150 can be fixed on the encapsulant 140 and the lead frame 110 through coupling the couplers 166 to the lead frame 110, such that the lens structure 150 is convenient to be detached or assembled to the lead frame 110. Other relevant structural details of the fourth embodiment are all the same as the first embodiment, and, therefore, a description in this regard will not be repeated hereinafter.

Figure 6:
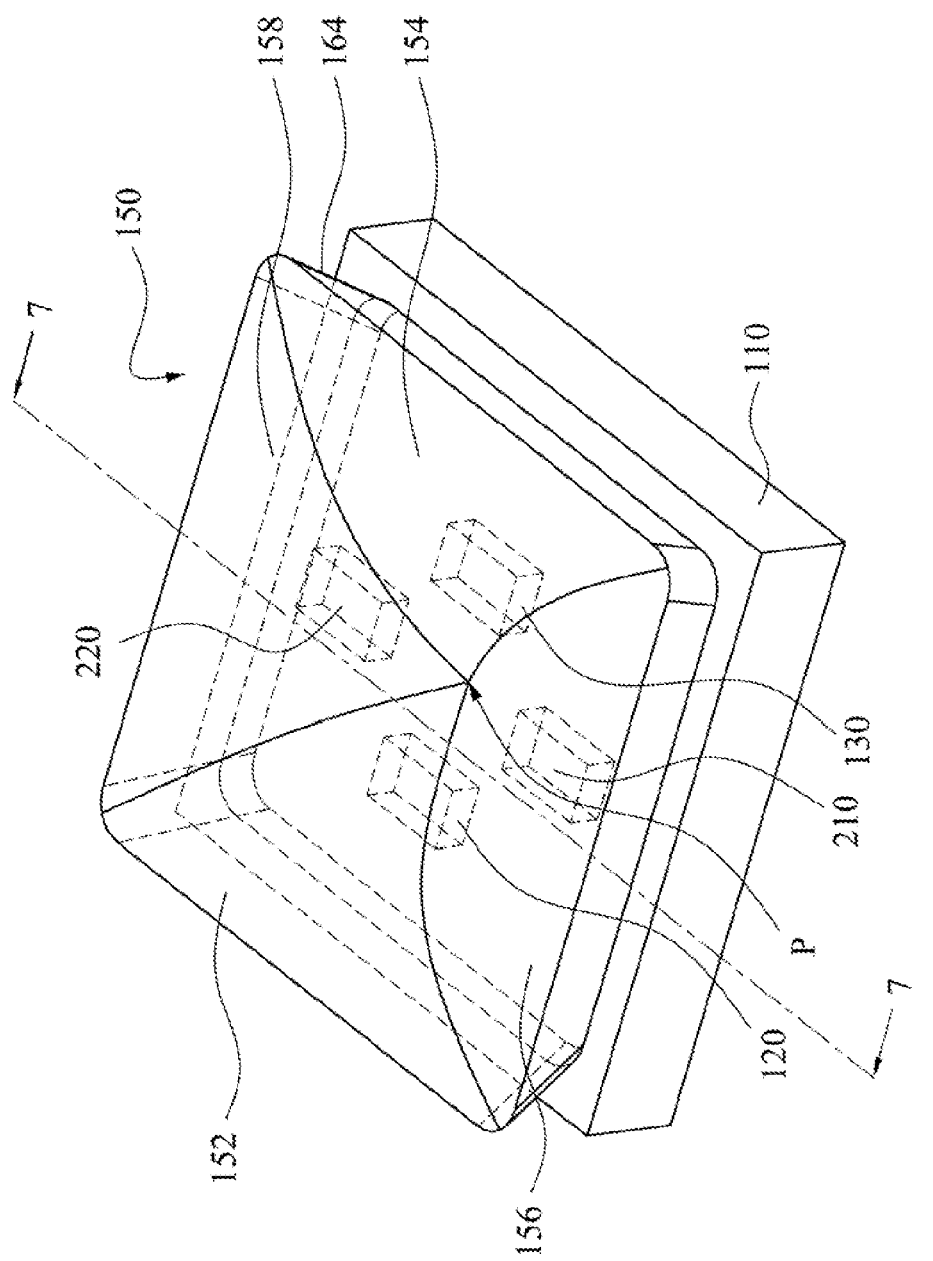
FIG. 6 is a three dimensional view of a light emitting diode module according to the fifth embodiment of the present invention.
Figure 7:
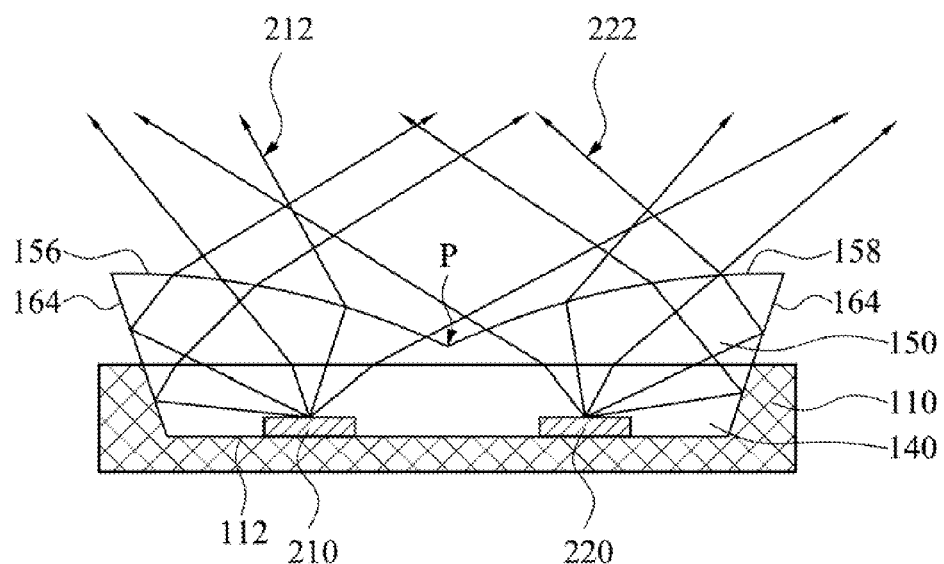
FIG. 7 is a cross sectional view taken along line 7-7 in FIG. 6.

FIG. 6 is a three dimensional view of a light emitting diode module according to the fifth embodiment of the present invention, and FIG. 7 is a cross sectional view taken along line 7-7 in FIG. 6. The difference between the fifth embodiment and the first embodiment pertains to a third light emitting diode chip 210 and a fourth light emitting diode chip 220. In this embodiment, the light emitting diode module can further include the third light emitting diode chip 210 and the fourth light emitting diode chip 220 respectively disposed at the projections of the third light emitting curved surface 156 and the fourth light emitting curved surface 158 on the die-bonding surface 112. The projection of the lowest point P on the die-bonding surface 112 is further between the third light emitting diode chip 210 and the fourth light emitting diode chip 220. Accordingly, the light emitting diode module in this embodiment can further mix light emitted from the third light emitting diode chip 210 and the fourth light emitting diode chip 220 via the lens structure 150, leading to a uniform optical output and/or an optical output enhancement of the light emitting diode module.

More specifically, reference is made to FIG. 7. The third light emitting diode chip 210 emits a third light beam 212 that directly emerges from the third light emitting curved surface 156 or emerges from the third light emitting curved surface 156 after being reflected by the reflective surface 164. The fourth light emitting diode chip 220 emits a fourth light beam 222 that directly emerges from the fourth light emitting curved surface 158 or emerges from the fourth light emitting curved surface 158 after being reflected by the reflective surface 164. In other words, for the third light emitting diode chip 210, the shape of the third light emitting curved surface 156 can be designed to control the propagation direction and uniformity of the third light beam 212. For example, the third light emitting curved surface 156 can be a surface curved away from the third light emitting diode chip 210. Furthermore, the reflective surface 164 can reflect a portion of the third light beam 212 to the third light emitting curved surface 156 to enhance the intensity of the third light beam 212. Similarly, for the fourth light emitting diode chip 220, the shape of the fourth light emitting curved surface 158 can be designed to control the propagation direction and uniformity of the fourth light beam 222. For example, the fourth light emitting curved surface 158 can be a surface curved away from the fourth light emitting diode chip 220. Furthermore, the reflective surface 164 can reflect a portion of the fourth light beam 222 to the fourth light emitting curved surface 158 to enhance the intensity of the fourth light beam 222.

In this embodiment, the wavelengths of the third light beam 212 and the fourth light beam 222 respectively emitted from the third light emitting diode chip 210 and the fourth light emitting diode chip 220 can be different. For example, the third light beam 212 can be blue light, and the fourth light beam 222 can be red light, and the claimed scope of the present invention is not limited in this respect. The blue light and the red light can be mixed to be purple light uniformly after they pass through the lens structure 150. Basically, an embodiment falls within the claimed scope of the present invention if at least two of the first light beam 122 (see FIG. 2), the second light beam 132 (see FIG. 2), the third light beam 212, and the fourth light beam 222 have different wavelengths, such that the lens structure 150 can mix the light beams.

Figure 8:
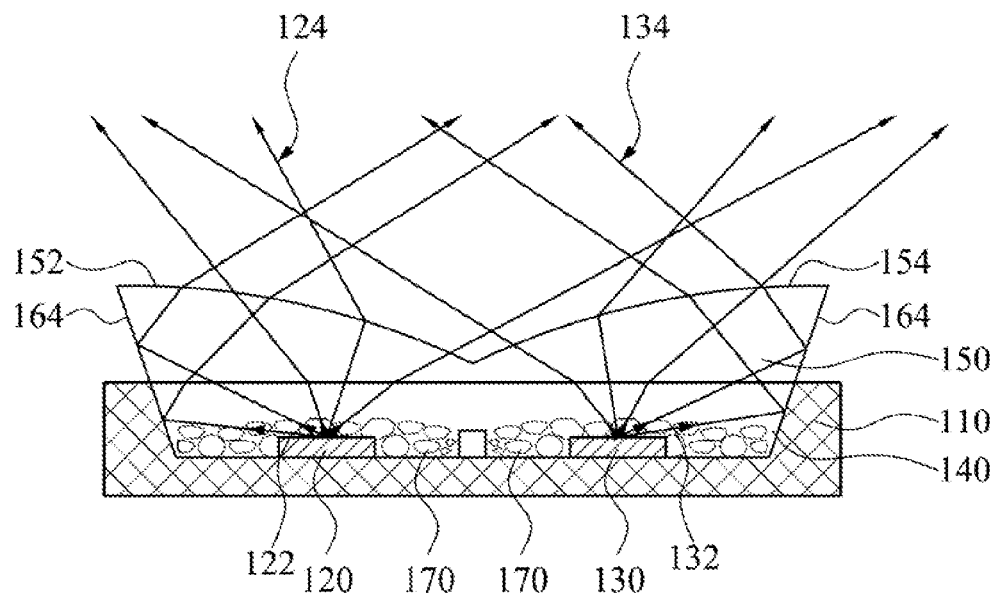
FIG. 8 is a cross sectional view of a light emitting diode module along one direction according to the sixth embodiment.
Figure 9:
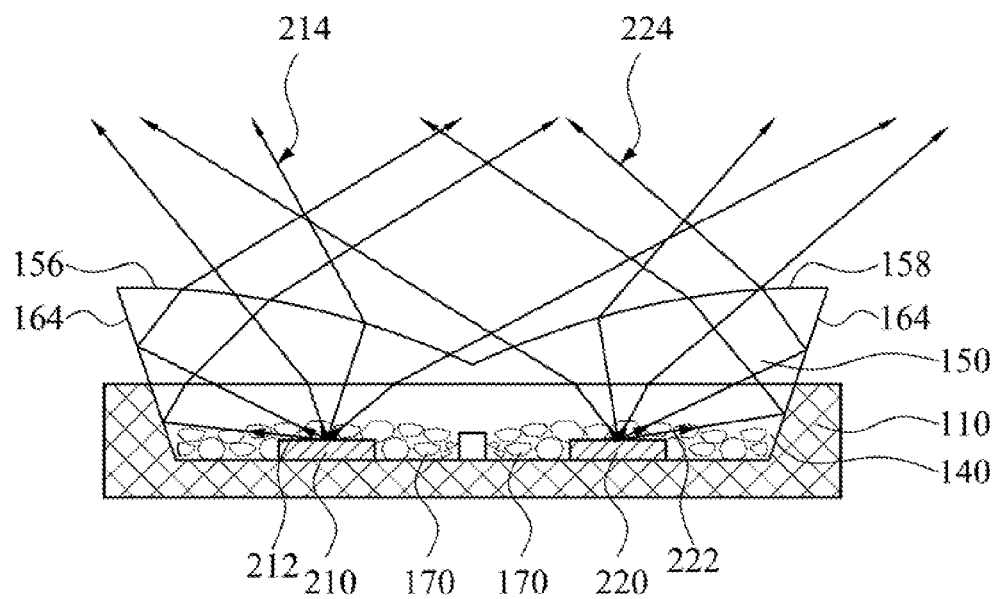
FIG. 9 is a cross sectional view of the light emitting diode module along another direction according to the sixth embodiment.

FIG. 8 is a cross sectional view of a light emitting diode module along one direction according to the sixth embodiment, where the cross sectional position of FIG. 8 is the same as that of FIG. 2. FIG. 9 is a cross sectional view of the light emitting diode module along another direction according to the sixth embodiment, where the cross sectional position of FIG. 9 is the same as that of FIG. 7. Reference is made to FIGS. 8 and 9. The difference between the sixth embodiment and the embodiment of FIG. 6 pertains to the wavelength conversion material 170. In this embodiment, the light emitting diode module can further include at least one of the wavelength conversion material 170 covering the first light emitting diode chips 120 and/or the second light emitting diode chips 130 and/or the third light emitting diode chips 210 and/or the fourth light emitting diode chips 220, and respectively converts a portion of the first light beam 122 and/or a portion of the second light beam 132 and/or a portion of the third light beam 212 and/or a portion of the fourth light beam 222 into the fifth light beam 124, the sixth light beam 134, a seventh light beam 214, and/or an eighth light beam 224. The wavelength of the fifth light beam 124 is greater than that of the first light beam 122, the wavelength of the sixth light beam 134 is greater than that of the second light beam 132, the wavelength of the seventh light beam 214 is greater than that of the third light beam 212, and the wavelength of the eighth light beam 224 is greater than that of the fourth light beam 222. For example, in this embodiment, the wavelength conversion materials 170 covers the first light emitting diode chips 120, the second light emitting diode chips 130, the third light emitting diode chips 210, and the fourth light emitting diode chips 220, and converts a portion of the first light beam 122, a portion of the second light beam 132, a portion of the third light beam 212, and a portion of the fourth light beam 222 into the fifth light beam 124, the sixth light beam 134, the seventh light beam 214, and the eighth light beam 224. However, the claimed scope of the present invention is not limited in this respect.

For the third light emitting diode chips 210 and the fourth light emitting diode chips 220, in one embodiment, the wavelengths of the third light beam 212 and the fourth light beam 222 can be the same, and the wavelengths of the seventh light beam 214 and the eighth light beam 224 can be different. In other words, the wavelength converting material 170 covering the third light emitting diode chip 210 can be different from the wavelength converting material 170 covering the fourth light emitting diode chip 220. In other embodiments, the wavelengths of the third light beam 212 and the fourth light beam 222 can be different, and the wavelengths of the seventh light beam 214 and the eighth light beam 224 can also be different. In yet another embodiments, the wavelength converting material 170 can only cover the third light emitting diode chip 210, such that the wavelength of the seventh light beam 214 is different from that of the fourth light beam 222. Basically, an embodiment falls within the claimed scope of the present invention if the light beams respectively emitted from the third light emitting diode chip 210 and the fourth light emitting diode chip 220 that incident the lens structure 150 have different wavelengths from each other, and the lens structure 150 can mix the light beams. As relevant structural details of the first light emitting diode chips 120 and the second light emitting diode chips 130 are all the same as that of the third light emitting diode chips 210 and the fourth light emitting diode chips 220, and, therefore, a description in this regard will not be repeated hereinafter.

Similarly, the fifth light beam 124, the sixth light beam 134, the seventh light beam 214, and the eighth light beam 224 that converted by the wavelength converting materials 170 can respectively directly emerge from the first light emitting curved surface 152, the second light emitting curved surface 154, the third light emitting curved surface 156, and the fourth light emitting curved surface 158, or emerge from the first light emitting curved surface 152, the second light emitting curved surface 154, the third light emitting curved surface 156, and the fourth light emitting curved surface 158 after being reflected by the reflective surface 164. Other relevant structural details of the sixth embodiment are all the same as the fifth embodiment, and, therefore, a description in this regard will not be repeated hereinafter.

It is noted that although the shape of the bottom surfaces 162 of the lens structure 150 of FIG. 1 and FIG. 6 are both rectangular, the claimed scope of the present invention is not limited in this respect. An embodiment falls within the claimed scope of the present invention if the shape of the bottom surfaces 162 of the lens structure 150 can be circular or polygon.

Figure 10:
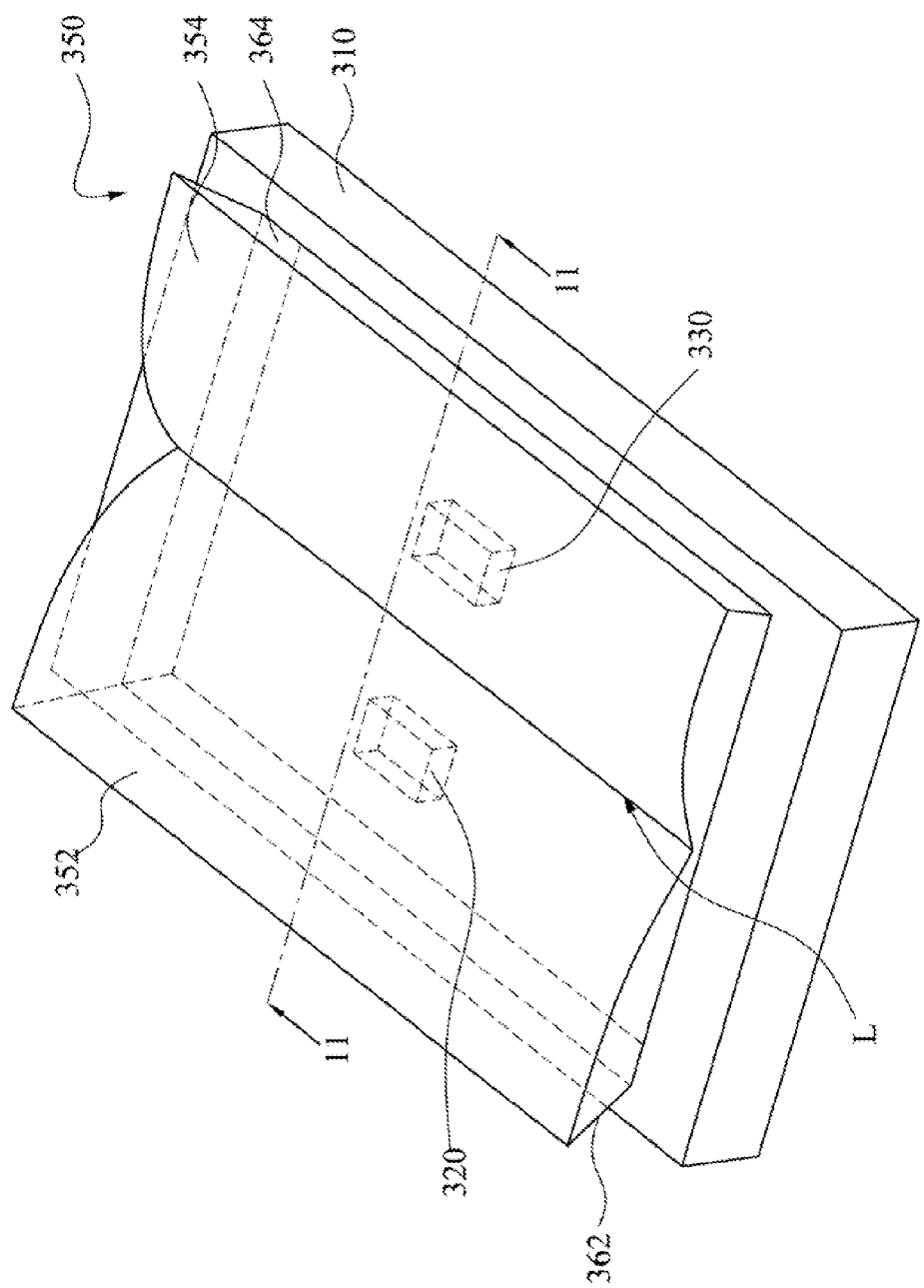
FIG. 10 is a three dimensional view of a light emitting diode module according to the seventh embodiment of the present invention.
Figure 11:
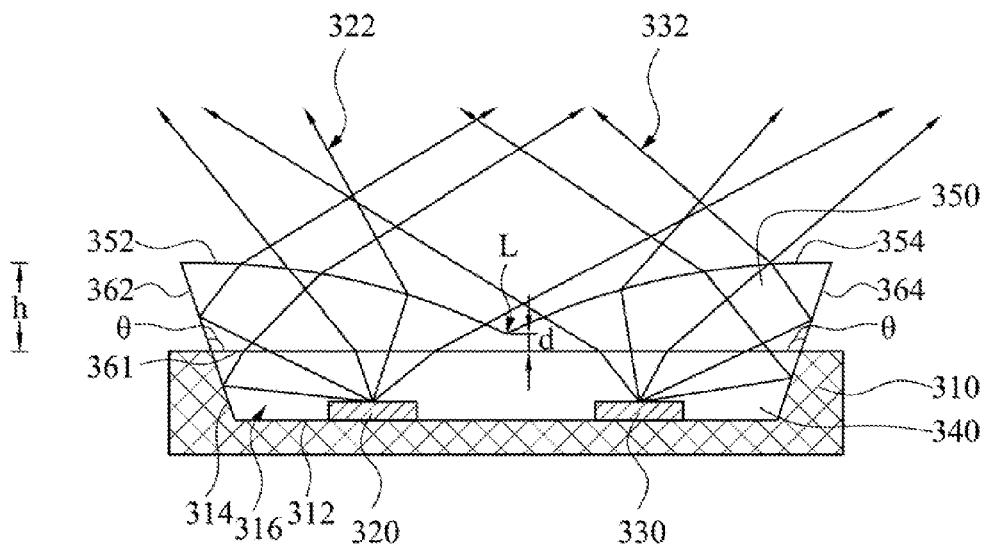
FIG. 11 is a cross sectional view taken along line 11-11 in FIG. 10.

FIG. 10 is a three dimensional view of a light emitting diode module according to the seventh embodiment of the present invention, and FIG. 11 is a cross sectional view taken along line 11-11 in FIG. 10. Reference is made to FIGS. 10 and 11. The light emitting diode module includes a lead frame 310, a first light emitting diode chip 320, a second light emitting diode chip 330, an encapsulant 340, and a lens structure 350. The lead frame 310 has a die-bonding surface 312 and at least one side wall 314 together defining an accommodating recess 316. The first light emitting diode chip 320 and the second light emitting diode chip 330 are separately disposed on the die-bonding surface 312 of the lead frame 310. The encapsulant 340 is filled in the accommodating recess 316 and covers the first light emitting diode chip 320 and the second light emitting diode chip 330. The lens structure 350 is disposed on the lead frame 340, and the lens structure 350 has a first reflective surface 362, a second reflective surface 364, a first light emitting curved surface 352, a second light emitting curved surface 354, and a bottom surface 361. The first light emitting curved surface 352 and the second light emitting curved surface 354 are disposed opposite to the bottom surface 361. The first reflective surface 362 and the second reflective surface 364 are respectively connected to the bottom surface 361, the first light emitting curved surface 352 and the second light emitting curved surface 354. An adjacent position between the first light emitting curved surface 352 and the second light emitting curved surface 354 is a lowest line L nearest to the bottom surface 361. The first light emitting diode chip 320 and the second light emitting diode chip 330 are respectively disposed at the projections of the first light emitting curved surface 352 and the second light emitting curved surface 354 on the die-bonding surface 312, and are symmetric with respect to a projection of the lowest line L on the die-bonding surface 312. Therefore, the light emitting diode module in this embodiment can mix light emitted from the first light emitting diode chip 320 and the second light emitting diode chip 330 via the lens structure 350, leading to a uniform optical output.

In greater detail, reference is made to FIG. 11. The first light emitting diode chip 320 emits a first light beam 322 that directly emerges from the first light emitting curved surface 352 or emerges from the first light emitting curved surface 352 after being reflected by the first reflective surface 362. The second light emitting diode chip 330 emits a second light beam 332 that directly emerges from the second light emitting curved surface 354 or emerges from the second light emitting curved surface 354 after being reflected by the second reflective surface 364. More specifically, for the first light emitting diode chip 320, the shape of the first light emitting curved surface 352 can be designed to control the propagation direction and uniformity of the first light beam 322. For example, the first light emitting curved surface 352 can be a surface curved away from the first light emitting diode chip 320. Furthermore, the first reflective surface 362 can reflect a portion of the first light beam 322 to the first light emitting curved surface 352 to enhance the intensity of the first light beam 322. Similarly, for the second light emitting diode chip 330, the shape of the second light emitting curved surface 354 can be designed to control the propagation direction and uniformity of the second light beam 332. For example, the second light emitting curved surface 354 can be a surface curved away from the second light emitting diode chip 330. Furthermore, the second reflective surface 364 can reflect a portion of the second light beam 332 to the second light emitting curved surface 354 to enhance the intensity of the second light beam 332.

In this embodiment, the wavelengths of the first light beam 322 and the second light beam 332 respectively emitted from the first light emitting diode chip 320 and the second light emitting diode chip 330 can be different. For example, the first light beam 322 can be blue light, and the second light beam 332 can be red light, and the claimed scope of the present invention is not limited in this respect. The blue light and the red light can be mixed to be purple light uniformly after they pass through the lens structure 350.

In one or more embodiments, the first reflective surface 362 and the second reflective surface 264 are total internal reflection (TIR) surfaces. In other words, the light can be reflected due to the reflective index difference between the lens structure 350 and surrounded medium, such as the air. However, the claimed scope of the present invention should not be limited in this respect. Basically, an embodiment falls within the claimed scope of the present invention if the first reflective surface 362 and the second reflective surface 364 can reflect the first light beam 322 and the second light beam 332, respectively.

In one or more embodiments, an angle $\theta$ can be formed between the first reflective surface 362 and the bottom surface 361, and another angle $\theta$ can be formed between the second reflective surface 364 and the bottom surface 361. The angles $\theta$ are about 90 degrees to 135 degrees. Accordingly, the first reflective surface 362 and the second reflective surface 364 can respectively guide the first light beam 322 and the second light beam 332 to the first light emitting curved surface 352 and the second light emitting curved surface 354, and the first light beam 322 and the second light beam 332 can be incident the first reflective surface 362 and the second reflective surface 364 at a large angle so as to be respectively reflected by the first reflective surface 362 and the second reflective surface 364.

In one or more embodiments, a distance d is formed between the lowest line L and the bottom surface 361. The lens structure 350 has a maximum thickness h, and the maximum thickness h and the distance d satisfy the following relationship:

$h>0$, and $0<d\leq(\frac{1}{2})h$. That is, the first light emitting curved surface 352 and the second light emitting curved surface 354 are caved in towards to the lowest line L. It is noted that the maximum thickness h can be defined as a maximum vertical distance between the bottom surface 361 and each of the first light emitting curved surface 352 and the second light emitting curved surface 354. Therefore, in FIG. 11, the maximum thickness h is the vertical distance between the bottom surface 361 and the adjacent position between the first light emitting curved surface 352 and the first reflective surface 362, and is also the vertical distance between the bottom surface 361 and the adjacent position between the second light emitting curved surface 354 and the second reflective surface 364. However, the claimed scope of the present invention should not be limited in this respect.

In one or more embodiments, the projection of the lowest line L on the die-bonding surface 312 passes through a center point between the first light emitting diode chip 320 and the second light emitting diode chip 330. In other words, the first light emitting diode chip 320 and the second light emitting diode chip 330 are symmetric with respect to the projection of the lowest line L on the die-bonding surface 312. As such, the propagation directions of the first light beam 322 and the second light beam 332 passing through the lens structure 350 are symmetric with respect to the lowest line L if the shapes of the first light emitting curved surface 352 and the second light emitting curved surface 354 are symmetric with respect to the lowest line L, and the uniformity of the mixed light can be enhanced. In other embodiments, however, the projection of the lowest line L on the die-bonding surface 312 may not passes through the center point between the first light emitting diode chip 320 and the second light emitting diode chip 330. Basically, an embodiment falls within the claimed scope of the present invention if the projection of the lowest line L on the die-bonding surface 312 falls between the first light emitting diode chip 320 and the second light emitting diode chip 330.

In one or more embodiments, the lens structure 350 can be fixed on the lead frame 310 by adhering. For example, the lens structure 350 can be adhered on the encapsulant 340, and the claimed scope of the present invention is not limited in this respect. Basically, an embodiment falls within the claimed scope of the present invention if the lens structure 350 can be fixed on the lead frame 310 and/or the encapsulant 340.

Figure 12:
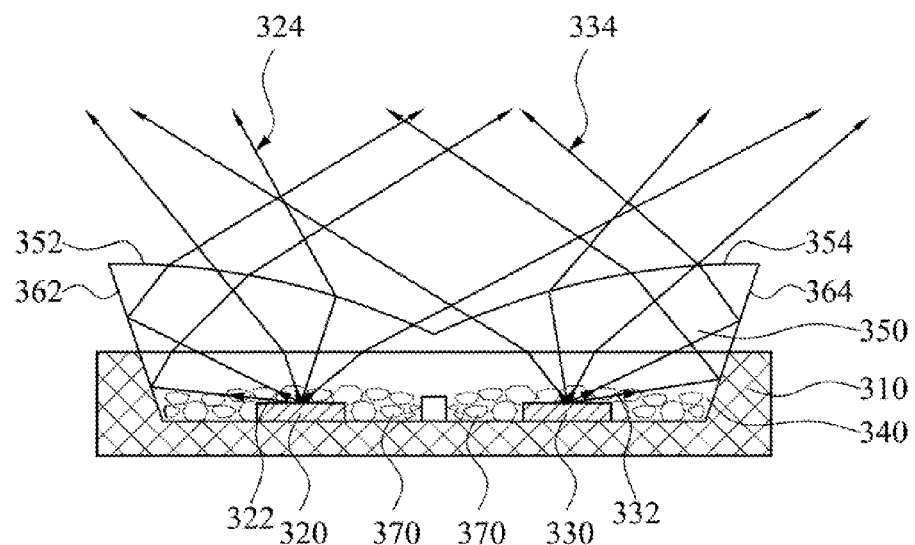
FIG. 12 is a cross sectional view of a light emitting diode module according to the eighth embodiment of the present invention.

Reference is made to FIG. 12 which is a cross sectional view of a light emitting diode module according to the eighth embodiment of the present invention. The cross sectional position of FIG. 12 is the same as that of FIG. 11. The difference between the eighth embodiment and the seventh embodiment pertains to the wavelength converting material 370. In this embodiment, the light emitting diode module further includes at least one wavelength converting material 370 covering the first light emitting diode chip 320 and/or the second light emitting diode chip 330, and respectively converting a portion of the first light beam 322 and/or a portion of the second light beam 332 into a third light beam 324 and/or a fourth light beam 334. The wavelength of the third light beam 324 is greater than that of the first light beam 322, and the wavelength of the fourth light beam 334 is greater than that of the second light beam 332. For example, in this embodiment, the wavelength converting materials 370 cover the first light emitting diode chip 320 and the second light emitting diode chip 330, and respectively converts a portion of the first light beam 322 and a portion of the second light beam 332 into the third light beam 324 and the fourth light beam 334.

In one embodiment, the wavelengths of the first light beam 322 and the second light beam 332 can be the same, and the wavelengths of the third light beam 324 and the fourth light beam 334 can be different. In other words, the wavelength converting material 370 covering the first light emitting diode chip 320 can be different from the wavelength converting material 370 covering the second light emitting diode chip 330. In other embodiments, the wavelengths of the first light beam 322 and the second light beam 332 can be different, and the wavelengths of the third light beam 324 and the fourth light beam 334 can also be different. In yet another embodiments, the wavelength converting material 370 can only cover the first light emitting diode chip 320, such that the wavelength of the third light beam 324 is different from that of the second light beam 332. Basically, an embodiment falls within the claimed scope of the present invention if the light beams respectively emitted from the first light emitting diode chip 320 and the second light emitting diode chip 330 that incident the lens structure 350 have different wavelengths from each other, such that the lens structure 350 can mix the light beams.

Similarly, the third light beam 324 converted by the wavelength converting material 370 can directly emerge from the first light emitting curved surface 352, or emerge from the first light emitting curved surface 352 after being reflected by the first reflective surface 362. The fourth light beam 334 converted by the wavelength converting material 370 can directly emerge from the second light emitting curved surface 354, or emerge from the second light emitting curved surface 354 after being reflected by the second reflective surface 364. Other relevant structural details of the eighth embodiment are all the same as the seventh embodiment, and, therefore, a description in this regard will not be repeated hereinafter.

Figure 13:
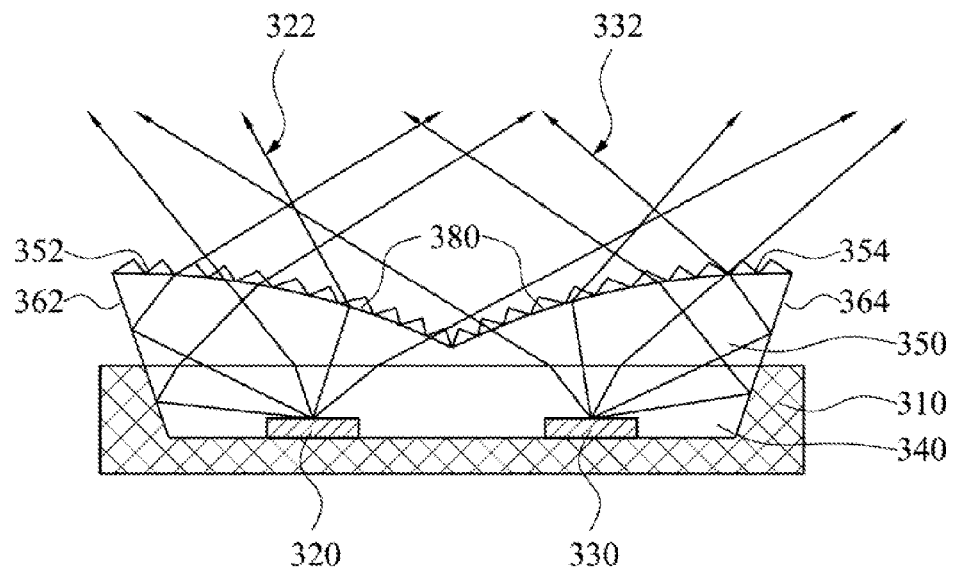
FIG. 13 is a cross sectional view of a light emitting diode modal according to the ninth embodiment of the present invention.

Reference is made to FIG. 13 which is a cross sectional view of a light emitting diode module according to the ninth embodiment of the present invention. The cross sectional position of FIG. 13 is the same as that of FIG. 11. The difference between the ninth embodiment and the seventh embodiment pertains to microstructures 380. In this embodiment, the light emitting diode module can further include a plurality of the microstructures 380 disposed on the first light emitting curved surface 352 and/or the second light emitting curved surface 354 of the lens structure 350. For example, the microstructures 380 are disposed on the first light emitting curved surface 352 and the second light emitting curved surface 354 of the lens structure 350 in FIG. 13. More specifically, the first light beam 322 and the second light beam 332 can be incident on the microstructures 380 respectively through the first light emitting curved surface 352 and the second light emitting curved surface 354. The microstructures 380 are configured for further deflecting the first light beam 322 and/or the second light beam 332 to enlarge the light emitting angles of the first light beam 322 and/or the second light beam 332, and the optical properties of the light emitting diode module can be controlled. Other relevant structural details of the ninth embodiment are all the same as the seventh embodiment, and, therefore, a description in this regard will not be repeated hereinafter.

Figure 14:
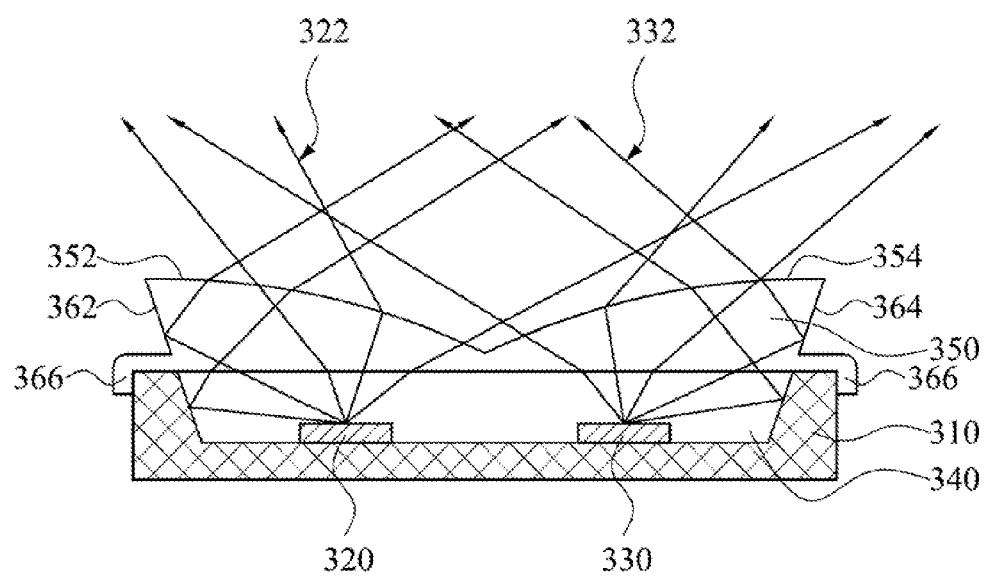
FIG. 14 is a cross sectional view of a light emitting diode module according to the tenth embodiment of the present invention.

Reference is made to FIG. 14 which is a cross sectional view of a light emitting diode module according to the tenth embodiment of the present invention. The cross sectional position of FIG. 14 is the same as that of FIG. 11. The difference between the tenth embodiment and the seventh embodiment pertains to the configuration of the lens structure 350. In this embodiment, the lens structure 350 is detachably disposed on the lead frame 310. In the embodiment of FIG. 14, the lens structure 350 can include two couplers 366 respectively connected to the first reflective surface 362 and the second reflective surface 364. The lens structure 350 can be fixed on the encapsulant 340 and the lead frame 310 through coupling the couplers 366 to the lead frame 310, such that the lens structure 350 is convenient to be detached or assembled to the lead frame 310. Other relevant structural details of the tenth embodiment are all the same as the seventh embodiment, and, therefore, a description in this regard will not be repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode module, comprising:
a lead frame having a die-bonding surface and at least one side wall together defining an accommodating recess;
a first light emitting diode chip and a second light emitting diode chip separately disposed on the die-bonding surface of the lead frame;
an encapsulant filled in the accommodating recess and covering the first and the second light emitting diode chips; and
a lens structure disposed on the lead frame, the lens structure having a first light emitting curved surface, a second light emitting curved surface, a third light emitting curved surface, a fourth light emitting curved surface, a bottom surface, and at least one reflective surface, wherein the first, the second, the third, and the fourth light emitting curved surfaces are disposed opposite to the bottom surface; an adjacent position among the first, the second, the third, and the fourth light emitting curved surfaces is a lowest point nearest to the bottom surface; the first and the second light emitting curved surfaces are symmetric with respect to the lowest point; the third and the fourth light emitting curved surfaces are symmetric with respect to the lowest point; the third light emitting curved surface is adjacent to the first and the second light emitting curved surfaces and the fourth light emitting curved surface is adjacent to the first and the second light emitting curved surfaces, wherein the reflective surface is connected to the first, the second, the third, the fourth light emitting curved surfaces, and edges of the bottom surface, wherein the first and the second light emitting diode chips are respectively disposed at projections of the first and the second light emitting curved surfaces on the die-bonding surface, and a projection of the lowest point on the die-bonding surface is between the first and the second light emitting diode chips.

2. The light emitting diode module of claim 1, wherein the first light emitting diode chip emits a first light beam that directly emerges from the first light emitting curved surface or emerges from the first light emitting curved surface after being reflected by the reflective surface, and the second light emitting diode chip emits a second light beam that directly emerges from the second light emitting curved surface or emerges from the second light emitting curved surface after being reflected by the reflective surface.

3. The light emitting diode module of claim 2, wherein wavelengths of the first and the second light beams respectively emitted from the first and the second light emitting diode chips are the same or different.

4. The light emitting diode module of claim 3, further comprising a third light emitting diode chip and a fourth light emitting diode chip respectively disposed at projections of the third and the fourth light emitting curved surfaces on the die-bonding surface, and the projection of the lowest point on the die-bonding surface is between the third and the fourth light emitting diode chips.

5. The light emitting diode module of claim 4, wherein the third light emitting diode chip emits a third light beam that directly emerges from the third light emitting curved surface or emerges from the third light emitting curved surface after being reflected by the reflective surface, and the fourth light emitting diode chip emits a fourth light beam that directly emerges from the fourth light emitting curved surface or emerges from the fourth light emitting curved surface after being reflected by the reflective surface.

6. The light emitting diode module of claim 5, wherein wavelengths of the third and the fourth light beams respectively emitted from the third and the fourth light emitting diode chips are the same or different.

7. The light emitting diode module of claim 2 further comprising at least one wavelength converting material covering the first or the second light emitting diode chip, and respectively converting a portion of the first light beam or a portion of the second light beam into a fifth light beam or a sixth light beam, wherein a wavelength of the fifth light beam is greater than the wavelength of the first light beam, and a wavelength of the sixth light beam is greater than the wavelength of the second light beam.

8. The light emitting diode module of claim 7, wherein the fifth and the sixth light beams respectively directly emerge from the first and the second light emitting curved surfaces, or emerge from the first and the second light emitting curved surfaces after being reflected by the reflective surface.

9. The light emitting diode module of claim 1, wherein the reflective surface is a total internal reflection surface.

10. The light emitting diode module of claim 9, wherein an angle is formed between the reflective surface and the bottom surface, and the angle is about 90 degrees to 135 degrees.

11. The light emitting diode module of claim 1, wherein a distance d is formed between the lowest point and the bottom surface, the lens structure has a maximum thickness h, and the maximum thickness h and the distance d satisfy the following relationship:

$h>0$, and $0<d\leq(\frac{1}{2})h$.

12. The light emitting diode module of claim 1, wherein the projection of the lowest point on the die-bonding surface overlaps a center point between the first and the second light emitting diode chips.

13. The light emitting diode module of claim 1, further comprising a plurality of microstructures disposed on the first, the second, the third, or the fourth light emitting curved surfaces of the lens structure.

14. The light emitting diode module of claim 1, wherein the lens structure is detachably disposed on the lead frame.

15. A light emitting diode module, comprising:
a lead frame having a die-bonding surface and at least one side wall together defining an accommodating recess;
a first light emitting diode chip and a second light emitting diode chip separately disposed on the die-bonding surface of the lead frame;
an encapsulant filled in the accommodating recess and covering the first and the second light emitting diode chips; and
a lens structure disposed on the lead frame, the lens structure having:
a first reflective surface and a second reflective surface;
a first light emitting curved surface and a second light emitting curved surface; and
a bottom surface,
wherein the first and the second light emitting curved surfaces are disposed opposite to the bottom surface, the first and the second reflective surfaces are respectively connected to the bottom surface and the first and the second light emitting curved surfaces, and an adjacent position between the first and the second light emitting curved surfaces is a lowest line nearest to the bottom surface; and
wherein the first and the second light emitting diode chips are respectively disposed at projections of the first and the second light emitting curved surfaces on the die-bonding surface, and are symmetric with respect to a projection of the lowest line on the die-bonding surface.

16. The light emitting diode module of claim 15, wherein the first light emitting diode chip emits a first light beam that directly emerges from the first light emitting curved surface or emerges from the first light emitting curved surface after being reflected by the first reflective surface, and the second light emitting diode chip emits a second light beam that directly emerges from the second light emitting curved surface or emerges from the second light emitting curved surface after being reflected by the second reflective surface.

17. The light emitting diode module of claim 16, wherein wavelengths of the first and the second light beams respectively emitted from the first and the second light emitting diode chips are the same or different.

18. The light emitting diode module of claim 17, further comprising at least one wavelength converting material covering the first or the second light emitting diode chip, and respectively converting a portion of the first light beam or a portion of the second light beam into a third light beam or a fourth light beam, wherein a wavelength of the third light beam is greater than the wavelength of the first light beam, and a wavelength of the fourth light beam is greater than the wavelength of the second light beam.

19. The light emitting diode module of claim 18, wherein the third and the fourth light beams respectively directly emerge from the first and the second light emitting curved surfaces, or emerge from the first and the second light emitting curved surfaces after being respectively reflected by the first and the second reflective surfaces.

20. The light emitting diode module of claim 15, wherein the projection of the lowest line on the die-bonding surface passes through a center point between the first and the second light emitting diode chips.

21. The light emitting diode module of claim 15 wherein the first and the second reflective surfaces are total internal reflection surfaces.

22. The light emitting diode module of claim 21, wherein an angle is formed between the first reflective surface and the bottom surface, and another angle is formed between the second reflective surface and the bottom surface, and the angles are about 90 degrees to 135 degrees respectively.

23. The light emitting diode module of claim 15, wherein a distance d is formed between the lowest line and the bottom surface, the lens structure has a maximum thickness h, and the maximum thickness h and the distance d satisfy the following relationship:

$h>0$, and $0<d\leq(\frac{1}{2})h$.

24. The light emitting diode module of claim 15, further comprising a plurality of microstructures disposed on the first or the second light emitting curved surfaces of the lens structure.

25. The light emitting diode module of claim 15, wherein the lens structure is detachably disposed on the lead frame.

* * * * *